US 9,576,974 B2

(12) United States Patent
Lee

(10) Patent No.: US 9,576,974 B2
(45) Date of Patent: Feb. 21, 2017

(54) MANUFACTURING METHOD OF SEMICONDUCTOR DEVICE

(71) Applicant: SK hynix Inc., Icheon-si, Gyeonggi-do (KR)

(72) Inventor: Sang Bum Lee, Incheon (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/870,164

(22) Filed: Sep. 30, 2015

(65) Prior Publication Data
US 2016/0322382 A1    Nov. 3, 2016

(30) Foreign Application Priority Data

Apr. 28, 2015    (KR) .................. 10-2015-0059984

(51) Int. Cl.
| | |
|---|---|
| *H01L 21/336* | (2006.01) |
| *H01L 27/115* | (2006.01) |
| *H01L 29/66* | (2006.01) |
| *H01L 29/423* | (2006.01) |
| *H01L 21/28* | (2006.01) |
| *H01L 21/311* | (2006.01) |
| *H01L 21/283* | (2006.01) |

(52) U.S. Cl.
CPC ....... *H01L 27/11582* (2013.01); *H01L 21/283* (2013.01); *H01L 21/28273* (2013.01); *H01L 21/28282* (2013.01); *H01L 21/31116* (2013.01); *H01L 27/11519* (2013.01); *H01L 27/11521* (2013.01); *H01L 27/11556* (2013.01); *H01L 27/11565* (2013.01); *H01L 27/11568* (2013.01); *H01L 29/4236* (2013.01); *H01L 29/42336* (2013.01); *H01L 29/42352* (2013.01); *H01L 29/66825* (2013.01); *H01L 29/66833* (2013.01)

(58) Field of Classification Search
CPC .................... H01L 27/11551; H01L 27/11556; H01L 27/1157; H01L 27/11578; H01L 27/11582; H01L 29/7926; H01L 29/7889
USPC .......................... 438/257–267; 257/314–321
See application file for complete search history.

(56) References Cited

U.S. PATENT DOCUMENTS

| | | | | |
|---|---|---|---|---|
| 2012/0003800 A1* | 1/2012 | Lee | ................... | H01L 27/11551 438/261 |
| 2015/0155296 A1* | 6/2015 | Yoon | ................. | H01L 27/11582 257/324 |
| 2015/0380427 A1* | 12/2015 | Sasaki | ............... | H01L 27/11582 257/324 |

FOREIGN PATENT DOCUMENTS

KR    1020110128717 A    11/2011

* cited by examiner

*Primary Examiner* — Brook Kebede
(74) *Attorney, Agent, or Firm* — William Park & Associates Ltd.

(57) ABSTRACT

A method of manufacturing a semiconductor device includes forming on a lower structure, a first stack structure in which first material layers and second material layers are alternately stacked, forming, on the first stack structure, a second stack structure in which third material layers and fourth material layers are alternately stacked, forming preliminary holes penetrating the second stack structure, forming a fifth material layer covering the preliminary holes on the second stack structure to define a first air-gap inside the preliminary holes, and forming through holes connected to the preliminary holes by penetrating from the fifth material layer overlapping the preliminary holes to the first stack structure.

18 Claims, 14 Drawing Sheets

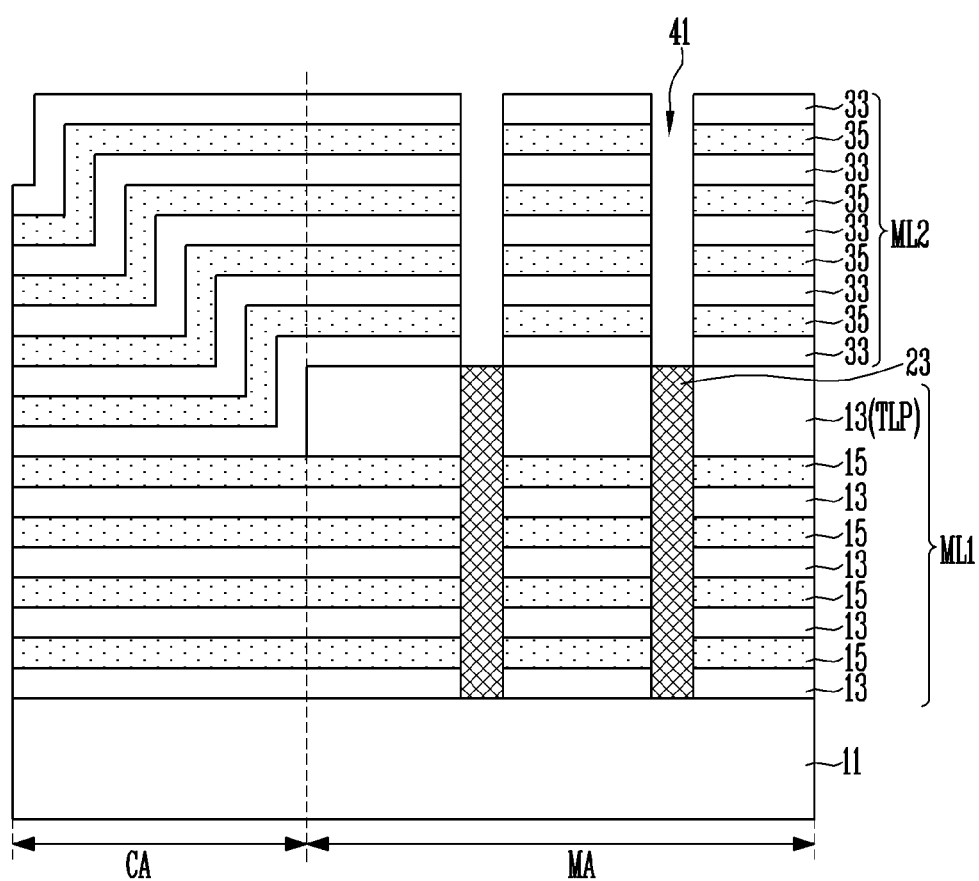

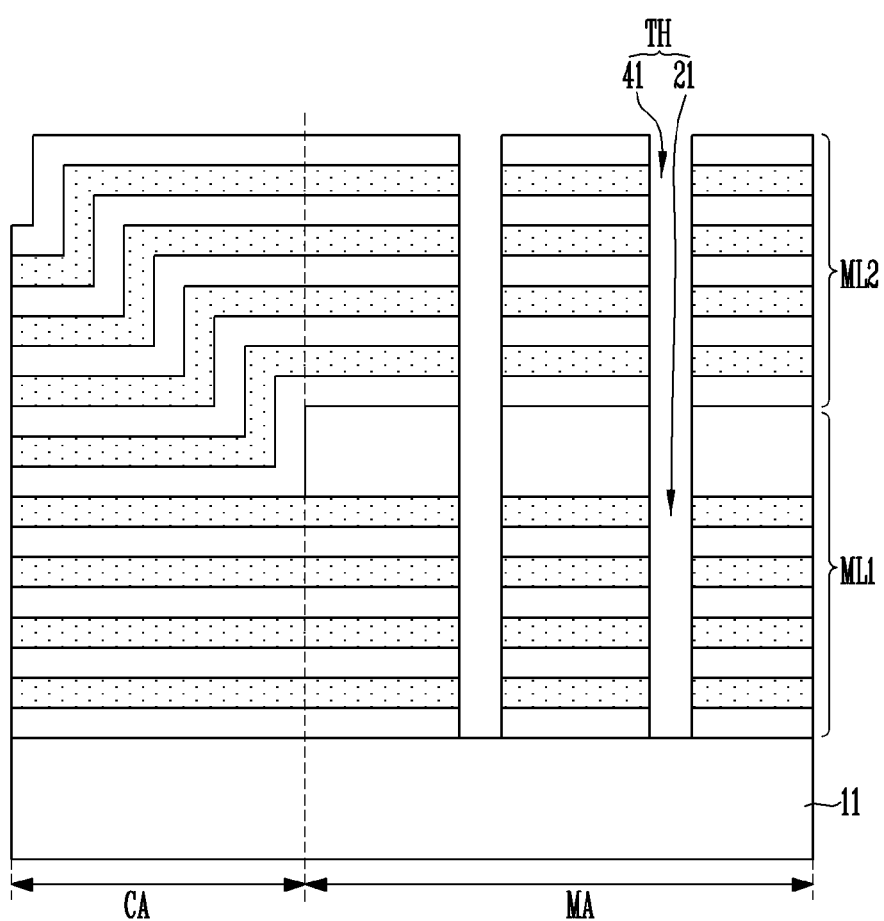

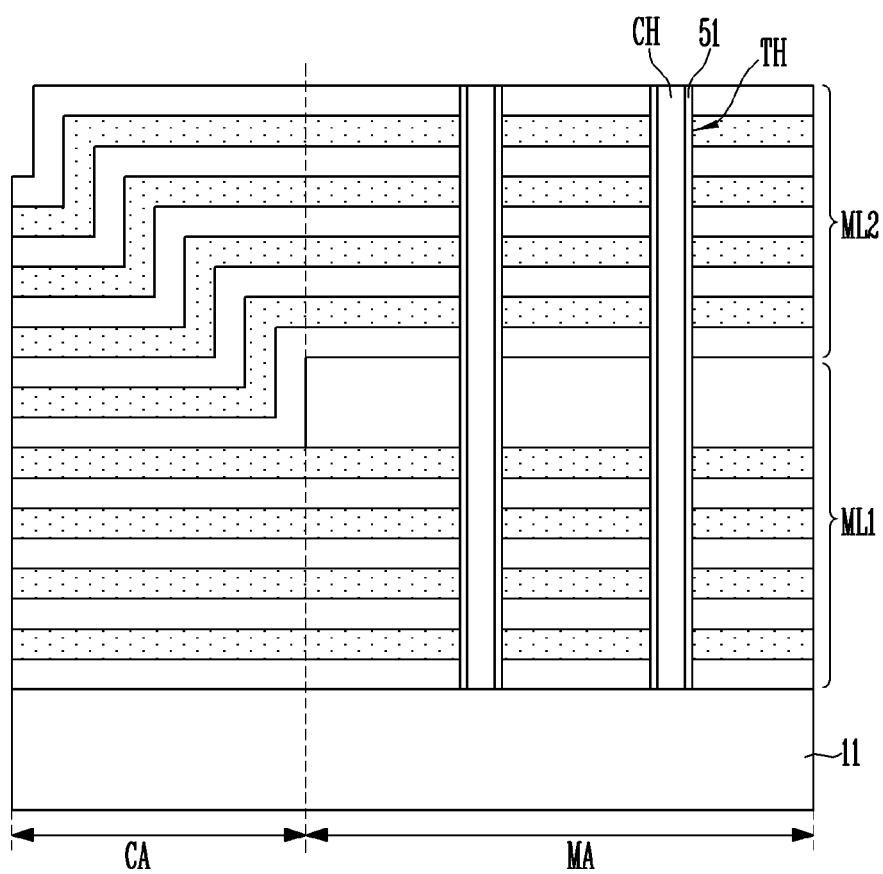

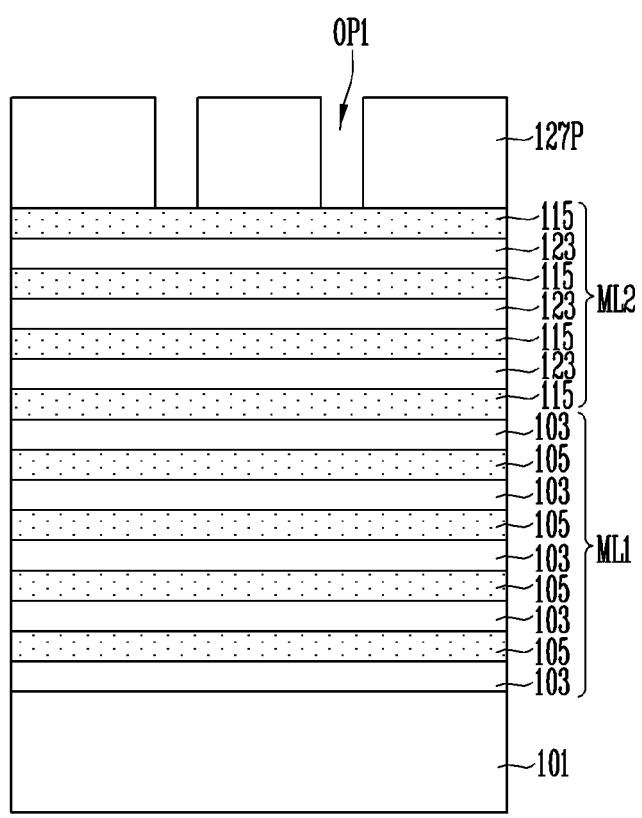

MANUFACTURING METHOD OF SEMICONDUCTOR DEVICE

CROSS-REFERENCE TO RELATED APPLICATION

The present application claims priority to Korean patent application 10-2015-0059984 filed on Apr. 28, 2015 in the Korean Intellectual Property Office, the entire disclosure of which is incorporated by reference herein.

BACKGROUND

1. Technical Field

An aspect of the application relates to a manufacturing method of a semiconductor device, and more particularly, to a manufacturing method of a semiconductor device including a through structure penetrating a stack structure.

2. Related Art

A technique of stacking memory cells on a substrate has been proposed for the purpose of high integration of a semiconductor device. In order to form memory cells stacked on a substrate, processes may be performed as follows.

First, a stack structure in which conductive patterns and insulating patterns are alternately stacked is formed on a substrate. Subsequently, a through structure penetrating the stack structure is formed. The through structure includes a channel layer used as a channel of memory cells. Accordingly, a memory string is formed, which includes memory cells connected in series along the channel layer, the memory cells being stacked on the substrate.

In order to improve the integration degree of the memory string, the number of stacked conductive patterns and stacked insulating patterns may be increased. Accordingly, the height of the stack structure increases, and therefore, the process of forming the through structure penetrating the stack structure is complicated.

SUMMARY

According to an embodiment, there is provided a method of manufacturing a semiconductor device, the method including forming, on a lower structure, a first stack structure in which first material layers and second material layers are alternately stacked. The method also includes forming, on the first stack structure, a second stack structure in which third material layers and fourth material layers are alternately stacked. The method also includes forming preliminary holes penetrating the second stack structure. The method also includes forming a fifth material layer covering the preliminary holes on the second stack structure to define a first air-gap is defined inside the preliminary holes. Further, the method includes forming through holes connected to the preliminary holes by penetrating from the fifth material layer overlapping the preliminary holes to the first stack structure.

According to an embodiment, there is provided a method of manufacturing a semiconductor device, the method including forming a first stack structure on a lower structure. The method also includes forming a second stack structure on the first stack structure. Further, the method includes forming channel layers penetrating the second stack structure and the first stack structure. The method also includes forming a preliminary slit penetrating the second stack structure between the channel layers. Further, the method includes forming a material layer covering the preliminary slit on the second stack structure to define an air-gap inside the preliminary slit. The method also includes forming a through slit connected to the preliminary slit by penetrating from the material layer overlapping the preliminary slit to the first stack structure.

According to an embodiment, a semiconductor device includes a first stack structure including first material layers alternately stacked with second material layers. The semiconductor device also includes a second stack structure formed on the first stack structure and including third material layers alternately stacked with fourth material layers. The semiconductor device also includes preliminary holes that penetrate the second stack structure. Further, the semiconductor device includes a fifth material layer that covers the preliminary holes and allows a first air-gap to be defined within the preliminary holes. In addition, the semiconductor device includes through holes connected to the preliminary holes by penetrating from the fifth layer.

The preliminary holes penetrate the second stack structure and not the first stack structure.

The first stack structure is etched at a different time from the second stack structure in response to the through holes being formed.

The fifth material layer is formed on the second stack structure and covers the preliminary holes and not disposed in any intermediate layer of a memory string.

The through hole connected to the preliminary holes is formed using the first air gap.

The semiconductor device further comprises a sixth material layer that blocks a preliminary slit to allow a second air gap to be defined within the preliminary slit.

When the first stack structure is etched at a different time from the second stack structure, a width of the preliminary slit is prevented from being extended.

The first material layers, the second material layers, the third material layers, and the fourth material layers are formed to a uniform thickness.

The semiconductor device further comprises a source-side through hole and a drain-side through hole each connected to an end of a trench to expose a sacrificial layer.

The semiconductor device comprises a through slit penetrating from a sixth material layer to the first stack structure is formed between a source-side channel layer and a drain-side channel layer.

The fifth material layer is formed with deposition material with step coverage characteristics and blocks the preliminary holes to define the first air-gap inside each preliminary hole.

When the first stack structure is etched at a different time from the second stack structure, the second stack structure is protected through a mask pattern.

The semiconductor device further comprises a through slit formed from an etching process of the second stack structure and from an etching process of the first stack structure that is different from the etching process of the second stack structure and at a different time.

The fifth material layer formed on the second stack structure is removed to allow a stepped structure to be formed.

The semiconductor device comprises a sixth material layer formed on the fifth material layer to allow a second air-gap to be defined within a preliminary slit.

BRIEF DESCRIPTION OF THE DRAWINGS

FIGS. 2A to 2E are sectional views illustrating a manufacturing method of a semiconductor device according to an embodiment of the invention.

FIGS. 3A to 3I are sectional views illustrating a manufacturing method of a semiconductor device according to an embodiment of the invention.

DETAILED DESCRIPTION

Hereinafter, embodiments of the invention will be described with reference to the accompanying figures in detail. However, the invention is not limited to an embodiment disclosed below and may be implemented in various forms and the scope of the invention is not limited to the following embodiments. Rather, the embodiments are provided to more sincerely and fully disclose the invention and to completely transfer the spirit of the invention to those skilled in the art to which the invention pertains, and the scope of the invention should be understood by the claims of the invention. Various embodiments provide a manufacturing method of a semiconductor device, which can simplify a process of forming a through structure penetrating a stack structure.

Figure 1A:
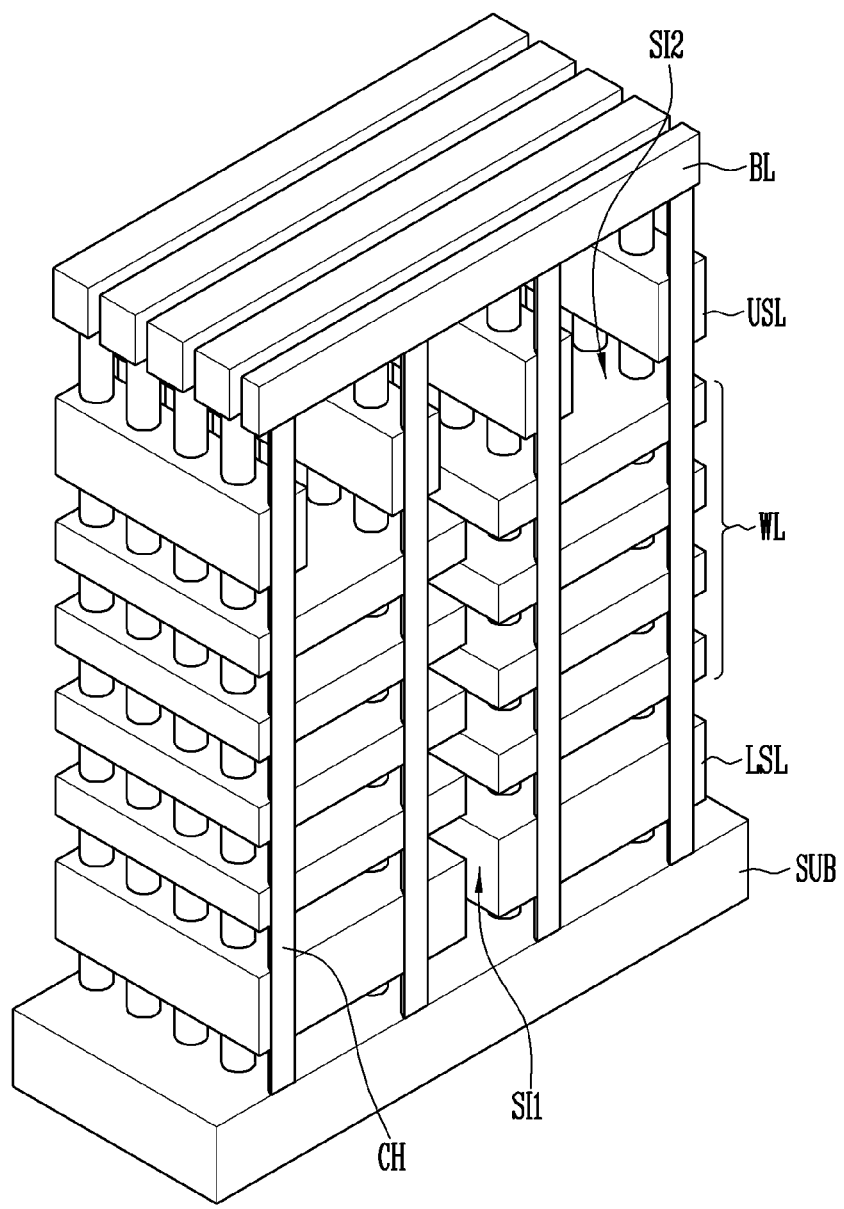
FIGS. 1A and 1B are perspective views illustrating structures of memory strings of a semiconductor device according to embodiments of the invention.
Figure 1B:
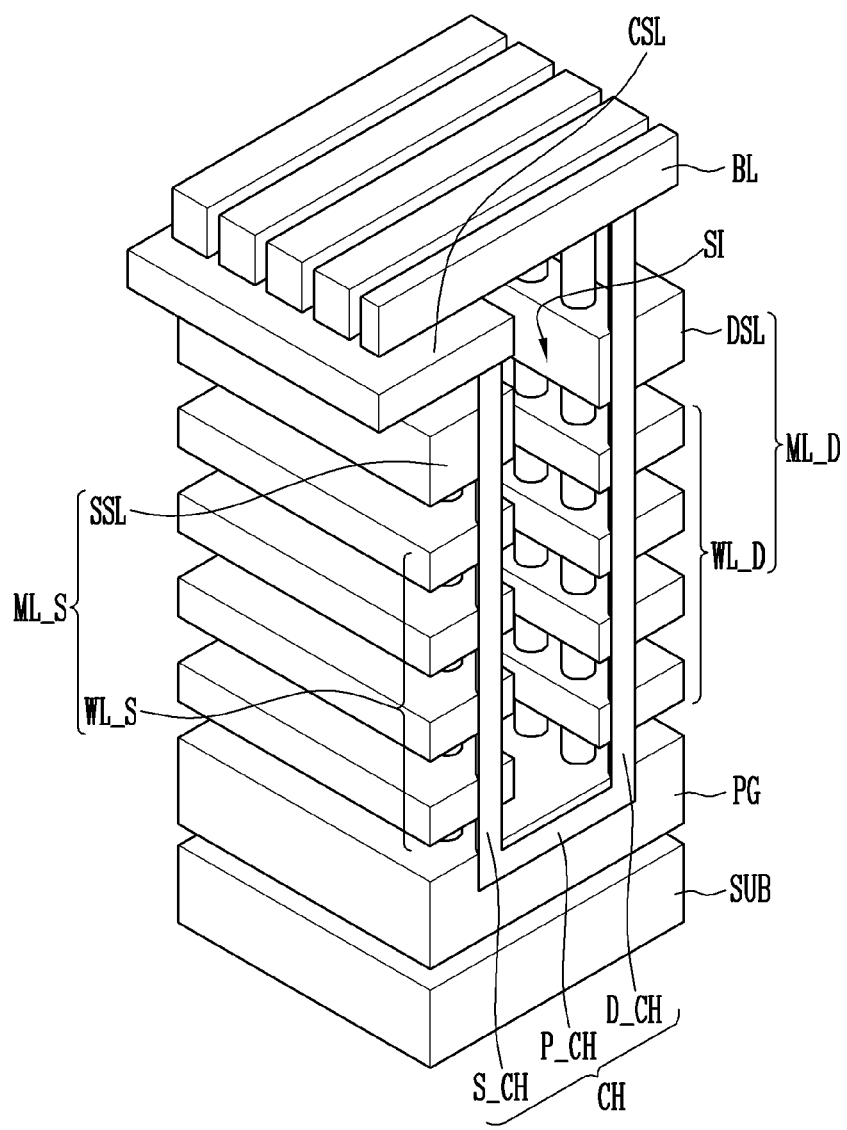

Referring to FIGS. 1A and 1B, perspective views illustrating structures of memory strings of a semiconductor device according to embodiments of the invention are illustrated. More specifically, FIG. 1A is a perspective view illustrating a structure of a straight-type memory string, and FIG. 1B is a perspective view illustrating a U-shaped memory string. For convenience of illustration, any insulating layer and any memory layer are not shown in FIGS. 1A and 1B.

In FIG. 1A, the memory string may be formed along a straight-type channel layer CH. The straight-type memory string may be electrically coupled between a semiconductor substrate SUB including a source area and a bit line BL. Conductive patterns LSL, WL, and USL are stacked to be spaced apart from each other between the semiconductor substrate SUB and the bit line BL. The conductive patterns LSL, WL, and USL may be separated from each other by a first through slit SI1.

The semiconductor substrate SUB including the source area may be directly electrically coupled to a lower end of the channel layer CH. The source area may be formed by implanting impurities into the semiconductor substrate SUB, or may be formed by depositing a doped silicon layer on the semiconductor substrate SUB.

The conductive patterns LSL, WL, and USL include a lower select line LSL, word lines WL, and an upper select line USL, which are sequentially stacked while surrounding the channel layer CH. The lower select line LSL may be disposed between the word lines WL and the semiconductor substrate SUB. The number of lower select lines LSL stacked between the word lines WL and the semiconductor substrate SUB may be one or two or more. The upper select line USL may be disposed between the word lines WL and the bit line BL. The number of upper select lines USL stacked between the word lines WL and the bit line BL may be one or two or more. Any one of the lower and upper select lines LSL and USL may be separated into smaller units than the word lines WL. For example, each of the word lines WL may be formed to surround channel layers CH of two or more columns. Further, the upper select line USL may be formed to surround a channel layer CH of one column. In this case, the upper select line USL may be separated, by a second through slit SI2, into units smaller than those into which the upper select line USL is separated by the first through slit SI1.

The channel layer CH penetrates the conductive patterns LSL, WL, and USL. A memory layer may be formed between the channel layer CH and the conductive patterns LSL, WL, and USL. An upper end of the channel layer CH is electrically coupled to the bit line BL.

According to the structure described above, memory cells are formed at intersection portions of the channel layer CH and the word lines WL. A lower select transistor is formed at an intersection portion of the channel layer CH and the lower select line LSL. Further, an upper select transistor is formed at an intersection portion of the channel layer CH and the upper select line USL. The lower select transistor, the memory cells, and the upper select transistor, which are arranged in a line along one channel layer CH, are connected in series through the channel layer CH to constitute one memory string.

In FIG. 1B, the memory string may be disposed along a channel layer CH electrically coupled between a bit line BL and a common source line CSL. The channel layer CH shown in FIG. 1B is formed in a U shape, but may be formed in various shapes including a W shape and the like. The bit line BL and the common source line CSL are disposed in different layers and spaced apart from each other. For example, the common source line CSL may be disposed under the bit line BL. The bit line BL and the common source line CSL are formed of a conductive material.

A pipe gate PG may be disposed below the bit line BL and the common source line CSL. The pipe gate PG is formed of a conductive material.

A drain-side stack structure ML_D and a source-side stack structure ML_S may be disposed on the pipe gate PG. The drain-side stack structure ML_D and the source-side stack structure ML_S are disposed under the bit line BL and the common source line CSL. The drain-side stack structure ML_D and the source-side stack structure ML_S may be electrically separated from each other by a through slit SI. The drain-side stack structure ML_D and the source-side stack structure ML_S are opposite to each other with the through slit SI interposed therebetween.

The drain-side stack structure ML_D includes drain-side conductive patterns WL_D and DSL which are stacked to be spaced apart from each other. The source-side stack structure ML_S includes source-side conductive patterns WL_S and SSL which are stacked to be spaced apart from each other. The drain-side conductive patterns WL_D and DSL include drain-side word lines WL_D and a drain select line DSL which are sequentially stacked. The drain-side word lines WL_D may be disposed between the bit line BL and the pipe gate PG. The drain select line DSL may be disposed between the bit line BL and the drain-side word lines WL_D. The number of drain select lines DSL stacked between the bit line BL and the drain-side word lines WL_D may be one or two or more. The source-side conductive patterns WL_S and SSL include source-side word lines WL_S and a source select line SSL which are sequentially stacked. The source-side word lines WL_S may be disposed between the common source line CSL and the pipe gate PG. The source select line SSL may be disposed between the common source line CSL and the source-side word lines WL_S. The number of source select lines SSL stacked between the common source line CSL and the source-side word lines WL_S may be one or two or more.

The channel layer CH may include a drain-side channel layer D_CH penetrating the drain-side stack structure ML_D, a source-side channel layer S_CH penetrating the source-side stack structure ML_S, and a pipe channel layer P_CH electrically coupling the drain-side channel layer D_CH and the source-side channel layer S_CH to each other by penetrating the pipe gate PG. An outer wall of the channel layer CH may be surrounded by a memory layer. An upper end of the drain-side channel layer D_CH may be electrically coupled to the bit line BL. An upper end of the source-side channel layer S_CH may be electrically coupled to the common source line CSL.

According to the structure described above, source-side memory cells are formed at intersection portions of the channel layer CH and the source-side word lines WL_S. In addition, a source select transistor is formed at an intersection portion of the channel layer CH and the source select line SSL. Drain-side memory cells are formed at intersection portions of the channel layer CH and the drain-side word lines WL_D. Further, a drain select transistor is formed at an intersection portion of the channel layer CH and the drain select line DSL. A pipe transistor is formed at an intersection portion of the channel layer CH and the pipe gate PG. The source select transistor, the source-side memory cells, the pipe transistor, the drain-side memory cells, and the drain select transistor, which are arranged along one channel layer CH, are connected in series through the channel layer CH to constitute one memory string.

A manufacturing method of a memory string having the above-described structure will be described in detail with reference to the accompanying drawings below.

Referring to FIGS. 2A to 2E, sectional views illustrating a manufacturing method of a semiconductor device according to an embodiment of the invention are illustrated.

Figure 2A:
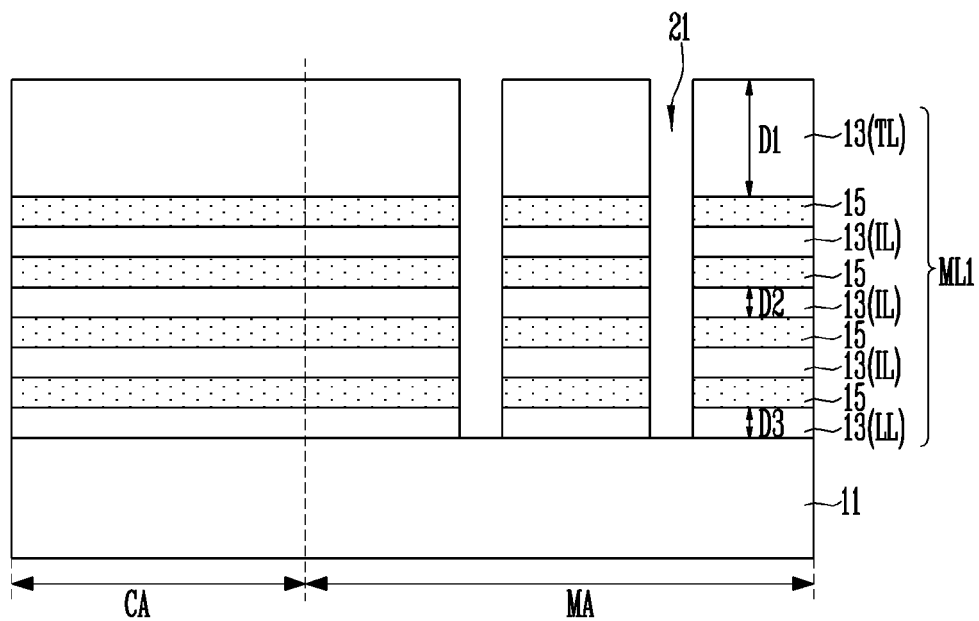

In FIG. 2A, first material layers 13 and second material layers 15 are alternately stacked on a previously formed lower structure 11, thereby forming a first stack structure ML1. The lower structure 11 may be a semiconductor substrate (SUB of FIG. 1A) including a source area. The lower structure 11 may be a pipe gate (PG of FIG. 1B) having a trench formed therein. The lower structure 11 may include a memory array area MA and a contact area CA.

The first material layers 13 may be formed in layers on which an insulating layer is disposed. In addition, the second material layers 15 may be formed in layers on which conductive patterns are disposed. The first material layers 13 and the second material layers 15 may be formed of different materials from each other. More specifically, the second material layers 15 may be formed of a material having an etching selection ratio with respect to the first material layers 13. For example, the first material layers 13 may be formed of an oxide. Further, the second material layers 15 may be formed of a conductive material. In the alternative, the first material layers 13 may be formed of an oxide. Further, the second material layers 15 may be formed of a sacrificial insulating material having an etching selection ratio with respect to the oxide. A nitride may be used as the sacrificial insulating material. Alternatively, the first material layers 13 may be formed of a sacrificial conductive material, and the second material layers 15 may be formed of a conductive material for conductive patterns. An undoped polysilicon may be used as the sacrificial conductive material. In addition, a doped polysilicon may be used as the conductive material for conductive patterns.

The first material layers 13 formed in the layers on which the insulating layer is disposed include a lowermost layer LL closest to the lower structure 11, a topmost layer TL most distant from the lower structure 11, and intermediate layers IL disposed between the lowermost layer LL and the topmost layer TL. A first thickness D1 of the topmost layer TL may be formed thicker than a second thickness D2 of each of the intermediate layer IL and a third thickness D3 of the lowermost layer LL. Accordingly, although the thickness of the topmost layer TL is decreased because a portion of the topmost layer TL is lost due to a subsequent planarization process of a sacrificial layer (23 of FIG. 2B), a critical thickness of the topmost layer TL can be secured.

Subsequently, a first through hole 21 penetrating the first stack structure ML1 is formed.

Figure 2B:
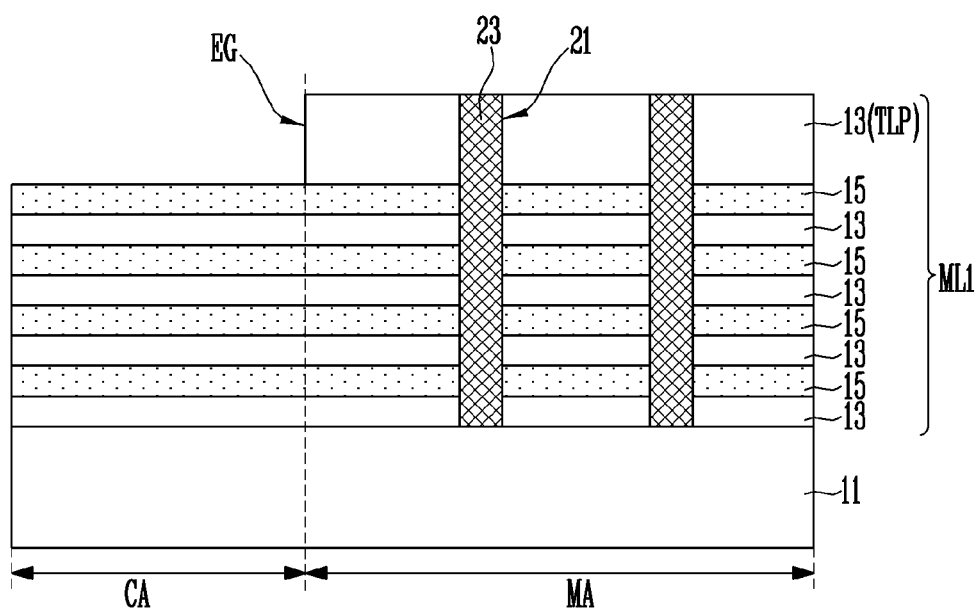

In FIG. 2B, a sacrificial layer 23 filled in the first through hole 21 is formed. The sacrificial layer 23 may be formed of a different material from the first and second material layers 13 and 15. More specifically, the sacrificial layer 23 may be formed of a material having an etching selection ratio with respect to the first and second material layers 13 and 15. For example, the sacrificial layer 23 may be formed of a titanium nitride layer (TiN).

In the process of forming the sacrificial layer 23, a surface of the sacrificial layer 23 may be planarized such that the topmost layer TL is exposed. Thus, the sacrificial layer 23 can remain only inside the first through hole 21. In this case, the thickness of the topmost layer TL may be thinner than the first thickness (D1 of FIG. 2A).

When the thickness of the topmost layer TL remains thicker than the second and third thicknesses (D2 and D3 of FIG. 2A), it is difficult to stably form a stepped structure in a process of forming the stepped structure in the contact area CA. To stably form the stepped structure in the contact area CA, the thicknesses of layers formed in the contact area CA are to be uniform. To this end, the topmost layer TL formed in the contact area CA may be removed through an etching process. Accordingly, a topmost layer pattern TLP opening the contact area CA is formed in the memory array area MA. An edge EG of the topmost layer pattern TLP may be disposed at a boundary between the contact area CA and the memory array area MA.

In FIG. 2C, third material layers 33 and fourth material layers 35 are alternately stacked on the first stack structure ML1 including the topmost layer pattern TLP, thereby forming a second stack structure ML2. The third material layers 33 and the fourth material layers 35 may be formed along a step difference caused by the topmost layer pattern TLP. The third material layers 33 may be formed in layers on which an insulating layer is disposed. Further, the fourth material layers 35 may be formed in layers on which conductive patterns are disposed. The third material layers 33 and the fourth material layers 35 may be formed of different materials from each other. More specifically, the fourth material layers 35 may be formed of a material having an etching selection ratio with respect to the third material layers 33. For example, the third material layers 33 may be formed of the same material as the first material layers 13. In addition, the fourth material layers 35 may be formed of the same material as the second material layers 15. The third material layers 33 may be uniformly formed with the second thickness D2 described in FIG. 2A. The fourth material layers 35 may be formed with the same thickness as the second material layers 15. Accordingly, the thicknesses of the first to fourth material layers 13, 15, 33, and 35 stacked in the contact area CA are uniformly formed. Thus, when a stepped structure is formed in the contact area CA, the stepped structure can be stably formed.

Subsequently, a second through hole 41 exposing the sacrificial layer 23 by penetrating the second stack structure ML2 is formed.

In FIG. 2D, the sacrificial layer (23 of FIG. 2C) is removed through the second through hole 41, thereby opening the first through hole 21. Accordingly, a vertical through hole TH including the first and second through holes 21 and 41 connected to each other is formed. Further, the lower structure 11 can be exposed through the vertical through hole TH. When the lower structure 11 includes a pipe gate, the vertical through hole TH may be connected to a trench of the pipe gate.

In FIG. 2E, a channel layer CH may be formed inside the vertical through hole TH. When the lower structure 11 includes a pipe gate, the channel layer CH may extend down to the inside of a trench of the pipe gate.

The channel layer CH is formed of a semiconductor material such as polysilicon. The channel layer CH may be formed in a tube type along the surface of the vertical through hole TH. In this instance, a central area of the tube-type channel layer CH may be filled with an insulating material. In the alternative, the channel layer CH may be formed in a filling type to be completely filled in the vertical through hole TH. Alternatively, the channel layer CH may be formed in a structure in which the tube type and the filling type are combined.

Before the channel layer CH is formed, a memory layer 51 may be further formed along the surface of the vertical through hole TH. The memory layer 51 may include any one of a tunnel insulating layer, a data storage layer, and a blocking insulating layer. The tunnel insulating layer is contacted with the channel layer CH, the data storage layer is contacted with the tunnel insulating layer, and the blocking insulating layer is contacted with the data storage layer. The tunnel insulating layer may be formed of a silicon oxide layer. Further, the data storage layer may be formed of a material layer in which charges can be trapped. For example, the data storage layer may be formed of a silicon nitride layer. The blocking insulating layer may include at least one of a silicon oxide layer and a high dielectric layer having a higher dielectric constant than the silicon oxide layer. When the lower structure 11 includes a pipe gate, the memory layer 51 may extend along the surface of a trench of the pipe gate.

Although not shown in this figure, after the channel layer CH is formed, subsequent processes may be performed, including an etching process for forming a stepped structure in the contact area CA, a process of forming a through slit penetrating the first and second stack structures ML1 and ML2 in the memory array area MA, and the like.

In the embodiment described in FIGS. 2A to 2E, the process of forming the vertical through hole TH is performed by being divided in a process of forming the first through hole 21 penetrating the first stack structure ML1 and a process of forming the second through hole 41 penetrating the second stack structure ML2. Accordingly, in an embodiment of the invention, it is possible to reduce the etch depth of a unit etching process, as compared with when the vertical through hole TH is formed by simultaneously etching the first and second stack structures ML1 and ML2. Accordingly, in an embodiment of the invention, it is possible to secure an etch margin in the etching process for forming the first through hole 21 and an etch margin in the etching process for forming the second through hole 41. In addition, before the second stack structure ML2 is formed, the sacrificial layer 23 is filled in the first through hole 21 so that it is possible to prevent the material layer constituting the second stack structure ML2 from being formed inside the first through hole 21.

In addition, the topmost layer TL of the first stack structure ML1 is formed with a thickness so that it is possible to reduce a phenomenon that a portion of the topmost layer TL is lost by the process of planarizing the sacrificial layer 23. To stably perform the process of forming the stepped structure, the topmost layer TL having a relatively thick thickness is removed in the contact area CA.

According to the embodiment described above, the process of forming the first stack structure ML1; the process of forming the first through hole 21; the process of forming the sacrificial layer 23; the process of removing the topmost layer TL of the first stack structure ML1 in the contact area; the process of forming the second stack structure ML2, the process of forming the second through hole 41; and the process of removing the sacrificial layer 23 are sequentially performed so as to form the vertical through hole TH.

In the following embodiment, a manufacturing method of a semiconductor device, in which the process of forming the sacrificial layer 23, the process of removing the sacrificial layer 23, and the process of removing the topmost layer TL of the first stack structure ML1 in the contact area in the above-described embodiment are omitted, so that the vertical through hole TH can be formed using a more simplified method, will be described in detail below.

Referring to FIGS. 3A to 3I, sectional views illustrating a manufacturing method of a semiconductor device according to an embodiment of the invention are shown. In FIGS. 3A to 3I, a memory array area is mainly shown.

In FIG. 3A, first material layers 103 and second material layers 105 are alternately stacked on a previously formed lower structure 101, thereby forming a first stack structure ML1. The lower structure 101 may be a semiconductor substrate (SUB of FIG. 1A) including a source area.

The first material layers 103 may be formed in layers on which an insulating layer is disposed. Further, the second material layers 105 may be formed in layers on which conductive patterns are disposed. The first material layers 103 and the second material layers 105 may be formed of different materials from each other. More specifically, the second material layers 105 may be formed of a material having an etching selection ratio with respect to the first material layers 103. For example, the first material layers 103 may be formed of an oxide. In addition, the second material layers 105 may be formed of a conductive material. Alternatively, the first material layers 103 may be formed of an oxide, and the second material layers 105 may be formed of a sacrificial insulating material having an etching selection ratio with respect to the oxide. A nitride may be used as the sacrificial insulating material. In the alternative, the first material layers 103 may be formed of a sacrificial conductive material, and the second material layers 105 may be a conductive material for conductive patterns. An undoped polysilicon may be used as the sacrificial conductive material, and a doped polysilicon may be used as the conductive material for conductive patterns.

Subsequently, third material layers 123 and fourth material layers 115 are alternately stacked on the first stack structure ML1, thereby forming a second stack structure ML2. The third material layers 123 may be formed in layers on which an insulating layer is disposed. Further, the fourth material layers 115 may be formed in layers on which conductive patterns are disposed. The third material layers 123 and the fourth material layers 115 may be formed of different materials from each other. More specifically, the fourth material layers 115 may be formed of a material having an etching selection ratio with respect to the third material layers 123. For example, the third material layers 123 may be formed of the same material as the first material layers 103. In addition, the fourth material layers 115 may be formed of the same material as the second material layers 105.

The first and second material layers 103 and 150 of the first stack structure may be formed with a uniform thickness. Further, the third and fourth material layers 123 and 115 of the second stack structure may be formed with a uniform thickness. Accordingly, when a subsequent etching process for forming a stepped structure in a contact area, the stepped structure can be stably formed at an end portion of each of the first and second stack structures ML1 and ML2.

The number of stacked first and second material layers 103 and 105 of the first stack structure ML1 and the number of stacked third and fourth material layers 123 and 115 of the second stack structure ML2 may be variously changed depending on a number of stacked select transistors and memory cells constituting a memory string.

After the first and second stack structures ML1 and ML2 are formed, a first mask pattern 127P is formed on the second stack structure ML2. The first mask pattern 127P may be formed using a photolithography process. The first mask pattern 127P includes first openings OP1.

Figure 3B:
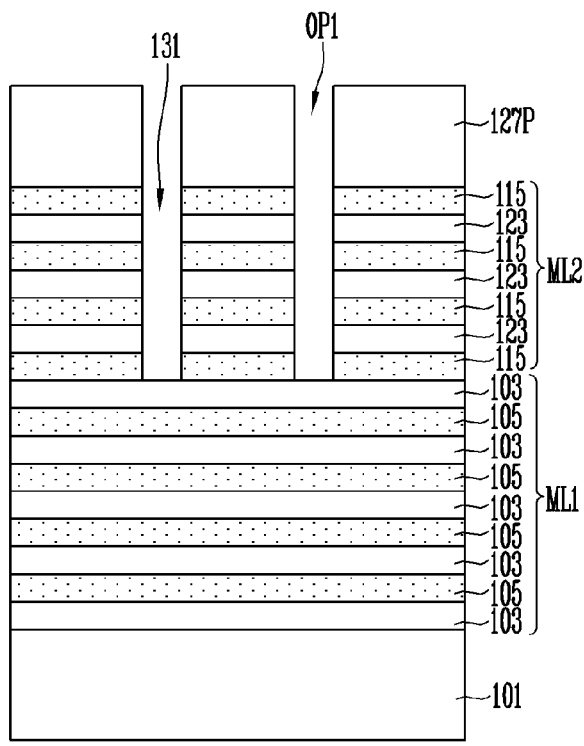

In FIG. 3B, the second stack structure ML2 is etched through an etching process using the first mask pattern 127P as an etch barrier. Accordingly, first preliminary holes 131 penetrating the second stack structure ML2 are formed. The formation positions of the first preliminary holes 131 are defined by the first openings OP1.

In an embodiment of the invention, the first preliminary holes 131 are not formed to a depth completely penetrating the first and second stack structure ML1 and ML2 but formed to a depth penetrating only the second stack structure ML2 formed close to the first mask pattern 127P. Accordingly, the etch depth in the etching process for forming the first preliminary holes 131 can be lowered, so that it is possible to secure an etch margin in the etching process for forming the first preliminary holes 131.

Figure 3C:
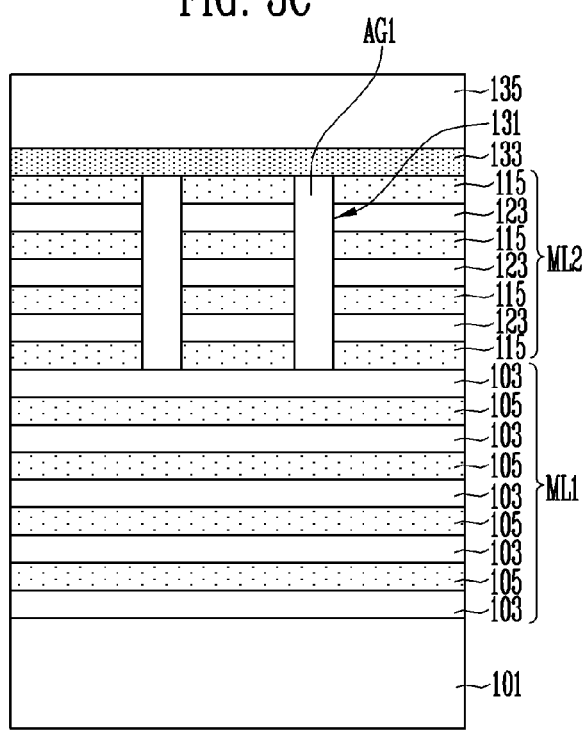

In FIG. 3C, after the first mask pattern 127P is removed, a fifth material layer 133 covering the first preliminary holes 131 is formed on the second stack structure ML2 such that a first air-gap AG1 is defined inside each of the first preliminary holes 131. The fifth material layer 133 may be formed using a deposition manner or deposition material having poor step coverage characteristics. The fifth material layer 133 having poor step coverage characteristics is not filled in the first preliminary holes 131 having a narrow width but blocks the first preliminary holes 131, thereby defining the first air-gap AG1 inside each of the first preliminary holes 131. The fifth material layer 133 having poor step coverage characteristics may include an undoped silicate glass (USG) oxide layer.

Subsequently, a second mask layer 135 may be formed on the fifth material layer 133.

Figure 3D:
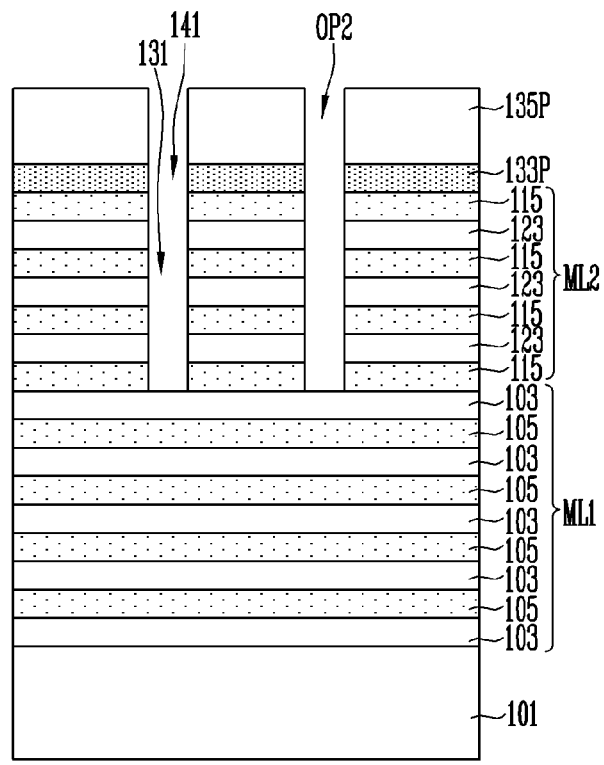

In FIG. 3D, a second mask pattern 135P is formed by patterning the second mask layer (135 of FIG. 3C). The second mask pattern 135P may be formed using a photolithography process. The second mask pattern 135P includes second openings OP2. The second openings OP2 overlap the first preliminary holes 131.

After that, a fifth material pattern 133P is formed by etching the fifth material layer (133 of FIG. 3C) through an etching process using the second mask pattern 135P as an etch barrier. The fifth material pattern 133P includes second preliminary holes 141 defined by the second openings OP2.

According to an embodiment of the invention, the second preliminary holes 141 are formed in a state in which the first preliminary holes 131 are not filled with the fifth material layer (133 of FIG. 3C) by defining the first air-gap AG1 inside each of the first preliminary holes 131. The second preliminary holes 141 overlap the first preliminary holes 131. Accordingly, although a process of removing a sacrificial layer and the like are not separately performed after the second preliminary holes 141 are formed, the first preliminary holes 131 are opened through the second preliminary holes 141. In addition, the second preliminary holes 141 are connected to the first preliminary holes 131.

Figure 3E:
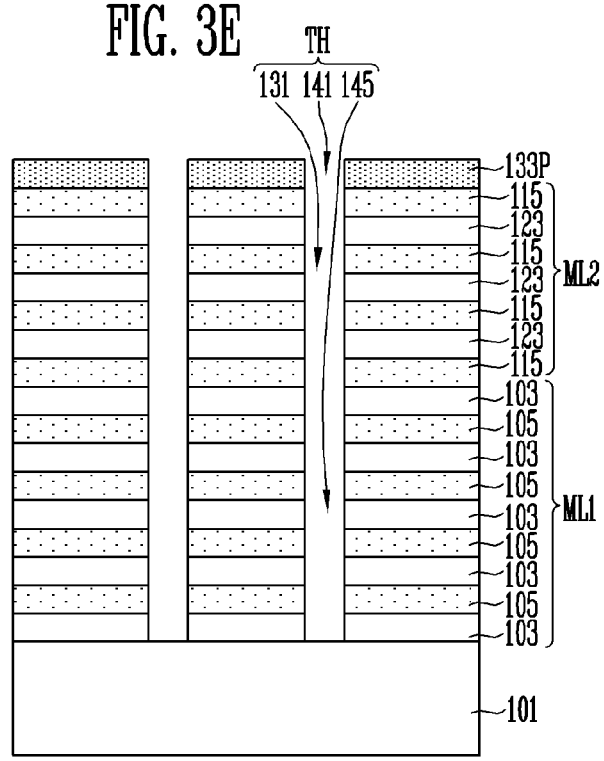

In FIG. 3E, the first stack structure ML1 exposed through the first preliminary holes 131 is etched through an etching process using the second mask pattern (135P of FIG. 3D) as an etch barrier. Accordingly, lower holes 145 penetrating the first stack structure ML1 are formed. The lower holes 145, the first preliminary holes 131, and the second preliminary holes 141 constitute vertical through holes TH. More specifically, each of the vertical through holes TH may be formed in a structure in which any one of the lower holes 145, any one of the first preliminary holes 131, and any one of the second preliminary holes 141 are connected to each other. Each of the vertical through holes TH having such a structure penetrates the first stack structure ML1 from the fifth material layer (133 of FIG. 3C). After the vertical through holes TH are formed, the second mask pattern (135P of FIG. 3D) may be removed.

According to an embodiment of the invention, when the vertical through holes TH are formed, the first and second stack structures ML1 and ML2 are not etched at the same time but etched through an etching process of the second stack structure ML2 and an etching process of the first stack structure ML1, which are distinguished from each other. While the first stack structure ML1 is being etched, the second stack structure ML2 is protected through the second mask pattern (135P of FIG. 3D). As such, it is possible to prevent excessive extension of the first preliminary hole 131 penetrating the second stack structure. Accordingly, it is possible to secure an etch margin in the etching processes for forming the vertical through holes TH, thereby reducing the occurrence of open defects in the narrow and long vertical through holes TH.

Unlike an embodiment of the invention, the process of forming the vertical through hole TH may include a process of forming the first stack structure ML1; a process of forming a lower hole penetrating the first stack structure ML1; a process of forming the fifth material layer (133 of FIG. 3C) defining an air-gap inside the lower hole; a process of forming the second stack structure ML2 on the fifth material layer (133 of FIG. 3C); and a process of forming an upper hole connected to the lower hole by penetrating the second stack structure ML2 and the fifth material layer (133 of FIG. 3C). In this case, the fifth material layer (133 of FIG. 3C) is disposed between the first stack structure ML1 and the second stack structure ML2. In this instance, the fifth material layer (133 of FIG. 3C) may be formed of a different material from the first to fourth material layers 103, 105, 123, and 115 constituting the first and second stack structures ML1 and ML2. In this case, when a subsequent process of forming a stepped structure is performed, it may be difficult to stably form the stepped structure. Further, the fifth material layer (133 of FIG. 3C) may deteriorate the uniformity of operation characteristics of memory cells constituting a memory string. In order to prevent this, there may be a limitation in selecting properties of the fifth material layer (133 of FIG. 3C). On the other hand, in an embodiment of the invention, the fifth material layer (133 of FIG. 3C) is formed on the second stack structure ML2, and thus it is possible to easily remove the fifth material layer (133 of FIG. 3C). Further, the fifth material layer (133 of FIG. 3C) is not disposed in an intermediate layer of a memory string, and thus it is possible to ensure the uniformity of operation characteristics of memory cells constituting the memory string. Accordingly, it is possible to broaden the range in which the properties of the fifth material layer are selected.

In an embodiment of the invention, although the first preliminary hole 131 is not filled with a sacrificial layer, the vertical through hole TH can be formed using the first air-gap AG1. Thus, it is possible to omit the process of forming the sacrificial layer, the process of planarizing the sacrificial layer, and the process of removing the sacrificial layer, which are described in FIGS. 2A to 2E. Further, the process of planarizing the sacrificial layer can be omitted, and thus it is unnecessary to thickly form any one of the first to fourth material layers 103, 105, 123, and 115 in consideration of the planarization process. Accordingly, the thicknesses of the first to fourth material layers 103, 105, 123, and 115 can be uniformly formed. As such, it is possible to omit a process of removing any one of the first to fourth material layers 103, 105, 123, and 115 in the contact area.

Figure 3F:
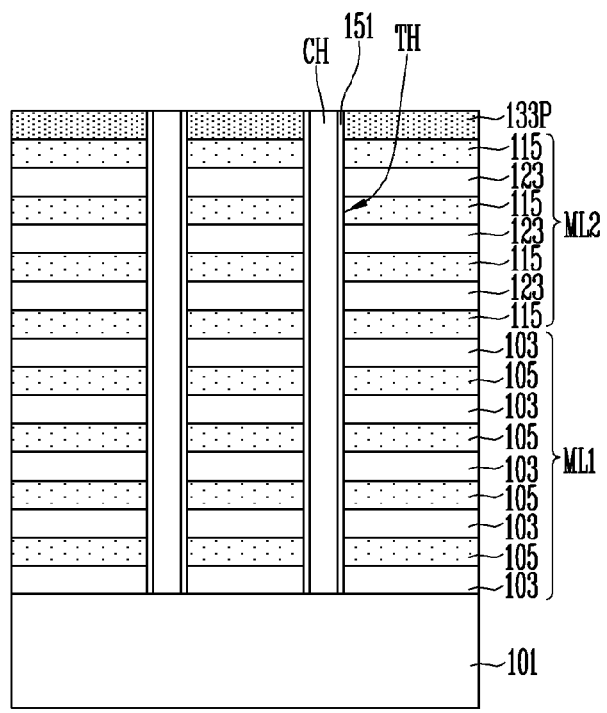

In FIG. 3F, channel layers CH may be formed inside the vertical through holes TH. When the lower structure 101 is a substrate including a source area, lower ends of the channel layers CH may be electrically coupled to the source area.

The channel layers CH are formed of a semiconductor material such as polysilicon. The channel layers CH may be formed in a tube type along sidewalls of the vertical through holes TH. In this case, an insulating material may be filled in a central area of each of the tube-type channel layers CH. Alternatively, the channel layers CH may be formed in a filling type to be completely filled in the vertical through holes TH. Alternatively, the channel layers CH may be formed in a structure in which the tube type and the filling type are combined.

Before the channel layers CH are formed, a memory layer 151 may be further formed along the sidewalls of the vertical through holes TH. The memory layer 151 may include any one of a tunnel insulating layer, a data storage layer, and a blocking insulating layer. The tunnel insulating layer is contacted with the channel layer CH, the data storage layer is contacted with the tunnel insulating layer. Further, the blocking insulating layer is contacted with the data storage layer. The tunnel insulating layer may be formed of a silicon oxide layer. In addition, the data storage layer may be formed of a material layer in which charges can be trapped. For example, the data storage layer may be formed of a silicon nitride layer. The blocking insulating layer may include at least one of a silicon oxide layer and a high dielectric layer having a higher dielectric constant than the silicon oxide layer.

Although not shown in this figure, after the channel layers CH are formed, an etching process for forming a stepped structure in the contact area may be performed.

Figure 3G:
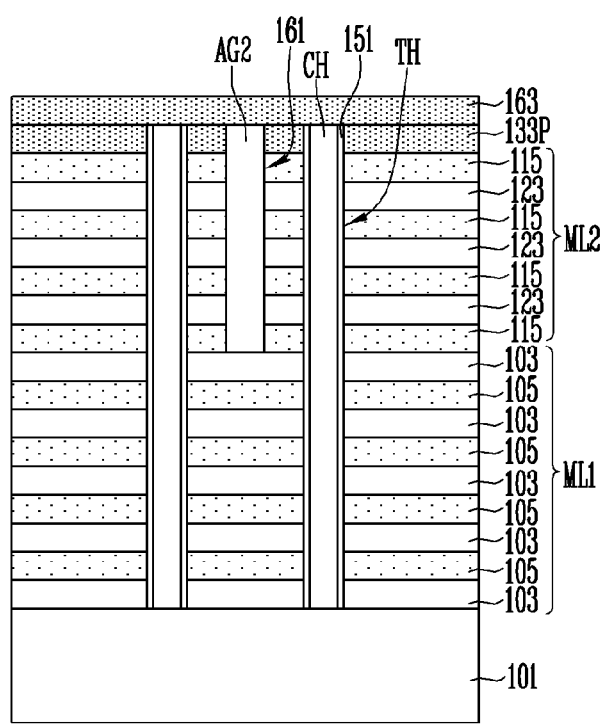

In FIG. 3G, a first preliminary slit 161 penetrating the fifth material pattern 133P and the second stack structure ML2 is formed by etching the fifth material pattern 133P and the second stack structure ML2 between the vertical through holes TH. The first preliminary slit 161 may be formed through an etching process using a third mask pattern as an etch barrier. Further, the third mask pattern may be removed after the first preliminary slit 161 is formed. The first preliminary slit 161 may extend along one direction.

Subsequently, a sixth material layer 163 covering the first preliminary slit 161 is formed on the fifth material layer 133P such that a second air-gap AG2 is defined inside the first preliminary slit 161. The sixth material layer 163 may be formed using a deposition manner or deposition material having poor step coverage characteristics. The sixth material layer 163 having poor step coverage characteristics is not filled in the first preliminary slit 161 having a narrow width but blocks the first preliminary slit 161, thereby defining the second air-gap AG2 inside the first preliminary slit 161. The sixth material layer 163 having poor step coverage characteristics may be formed of the same material as the fifth material layer 133 described in FIG. 3C. For example, the sixth material layer 163 may include an undoped silicate glass (USG) oxide layer.

Figure 3H:
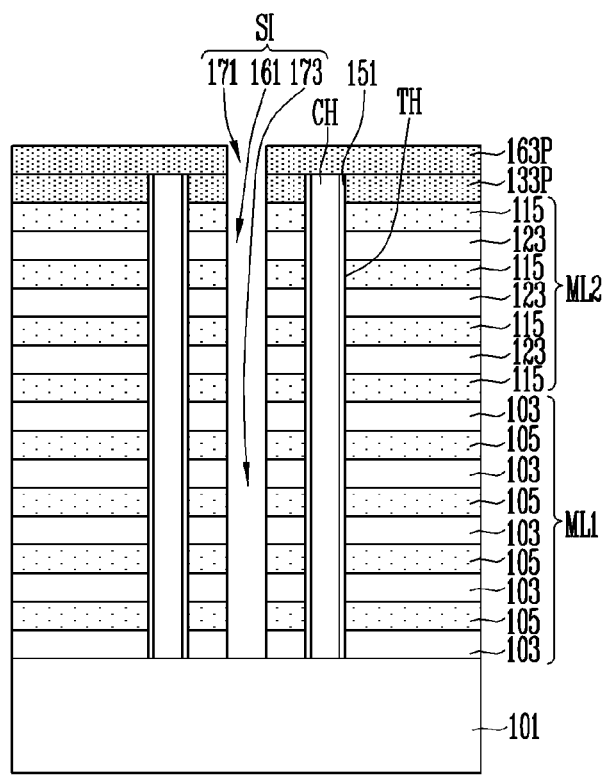

In FIG. 3H, a sixth material pattern 163P is formed by etching the sixth material layer (163 of FIG. 3G). The sixth material pattern 163P may be patterned through an etching process using a fourth mask pattern as an etch barrier. The sixth material pattern 163P overlaps the first preliminary slit 161, and includes a second preliminary slit 171 connected to the first preliminary slit 161.

According to an embodiment of the invention, the second preliminary slit 171 is formed in a state in which the first preliminary slit 161 is not filled with the sixth material layer (163 of FIG. 3G) by defining the second air-gap AG2 inside the first preliminary slit 161. The second preliminary slit 171 overlaps the first preliminary slit 161. Accordingly, although a process of removing a sacrificial layer is not separately performed after the second preliminary slit 171, the first preliminary slit 161 is opened through the second preliminary slit 171.

Subsequently, the first stack structure ML1 exposed through the first preliminary slit 161 is etched through an etching process using the fourth mask pattern as an etch barrier. Accordingly, a lower slit 173 penetrating the first stack structure ML1 is formed. The lower slit 173, the first preliminary slit 161, and the second preliminary slit 171 extend along one direction, and constitute a through slit SI. More specifically, the through slit SI may be formed in a structure in which the lower slit 173, the first preliminary slit 161, and the second preliminary slit 171 are connected to each other. The through slit SI may expose the lower structure 101 by penetrating from the sixth material layer (163 of FIG. 3G) to the first stack structure ML1. After the through slit SI is formed, the fourth mask pattern may be removed.

In an embodiment of the invention, the through slit SI is formed through an etching process of the second stack structure ML2 and an etching process of the first stack structure ML1, which are distinguished from each other. Further, while the first stack structure ML1 is being etched, the second stack structure ML2 can be protected through the fourth mask pattern. As such, it is possible to prevent the width of the first preliminary slit 161 penetrating the second stack structure ML2 from being excessively extended. Accordingly, it is possible to secure an etch margin in the etching processes for forming the through slit SI, thereby easily forming the narrow and long through slit SI.

Figure 3I:
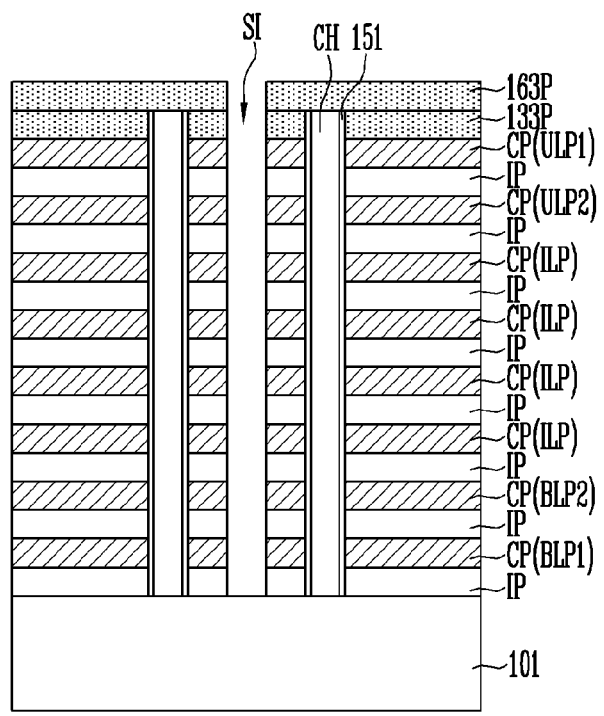

In FIG. 3I, a subsequent process continued after the through slit SI is formed may be varied according to properties of the first to fourth material layers 103, 105, 123, and 115 of FIG. 3H).

For example, when the first and third material layers (103 and 123 of FIG. 3H) are formed of an oxide and when the second and fourth material layers (105 and 115 of FIG. 3H) are formed of a conductive material, the first and third material layers (103 and 123 of FIG. 3H) remain as insulating patterns IP separated from each other by the through slit SI. Further, the second and fourth material layers (105 and 115 of FIG. 3H) remain as conductive patterns CP separated from each other by the through slit SI.

Unlike as described above, when the first and third material layers (103 and 123 of FIG. 3H) are formed of an oxide and when the second and fourth material layers (105 and 115 of FIG. 3H) are formed of a sacrificial insulating material, the second and fourth material layers (105 and 115 of FIG. 3H) may be removed through the through slit SI. After that, conductive patterns CP may be formed by filling seventh material layers formed of a conductive material in areas in which the second and fourth material layers (105 and 115 of FIG. 3H) are removed. The first and third material layers (103 and 123 of FIG. 3H) may remain as insulating patterns IP separated from each other by the through slit SI. Before the conductive patterns CP are formed, a memory layer (not shown) may be formed along surfaces of the areas in which the second and fourth material layers (105 and 115 of FIG. 3H) are removed. The conductive patterns CP may be formed of a metal silicide layer, a metal layer, a polysilicon layer, or the like.

Unlike as described above, when the first and third material layers (103 and 123 of FIG. 3H) are formed of a sacrificial conductive material and when the second and fourth material layers (105 and 115 of FIG. 3H) are formed of a conductive material for conductive patterns CP, the first and third material layers (103 and 123 of FIG. 3H) may be removed through the through slit SI. After that, insulating patterns IP may be formed by filling seventh material layers formed of an insulating material in areas in which the first and third material layers (103 and 123 of FIG. 3H) are removed. The second and fourth material layers (105 and 115 of FIG. 3H) may remain as conductive patterns CP separated from each other by the through slit SI.

Among the conductive patterns CP described above, lower conductive patterns BLP1 and BLP2 of at least one layer from the lowermost layer closest to the lower structure 101 may be used as the lower select line LSL shown in FIG. 1A. Among the conductive patterns CP, upper conductive patterns ULP1 and ULP2 of at least one layer from the topmost layer most distant from the lower structure 101 may be used as the upper select line USL shown in FIG. 1A. Among the conductive patterns CP, intermediate conductive patterns ILP between the lower conductive patterns BLP1 and BLP2 and the upper conductive patterns ULP1 and ULP2 may be used as the word lines WL shown in FIG. 1A. The through slit SI may extend along an extending direction of the conductive pattern CP.

Referring to FIGS. 4A to 4D, sectional views illustrating a manufacturing method of a semiconductor device according to an embodiment of the invention are illustrated. In FIGS. 4A to 4D, a memory array area is mainly shown.

Figure 4A:
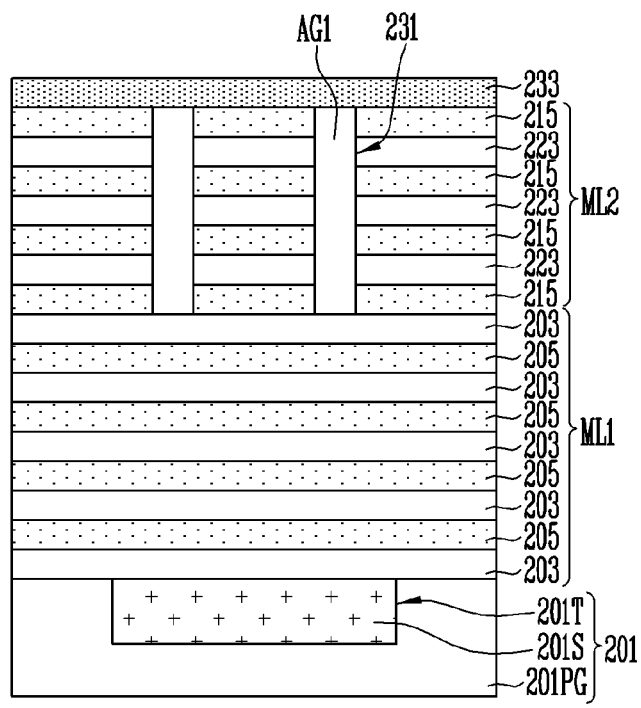
FIGS. 4A to 4D are sectional views illustrating a manufacturing method of a semiconductor device according to an embodiment of the invention.

In FIG. 4A, first material layers 203 and second material layers 205 are alternately stacked on a previously formed lower structure 201, thereby forming a first stack structure ML1.

Before the first stack structure ML1 is formed, the lower structure 201 may be formed. The process of forming the lower structure 201 may include a process of forming a pipe gate 201PG, a process of forming a trench 201T by etching the pipe gate 201PG, and a process of filling a sacrificial layer 201S inside the trench 201T.

The first material layers 203 and the second material layers 205 may be formed of the same material as described in FIG. 3A.

Subsequently, third material layers 223 and fourth material layers 215 are alternately stacked on the first stack structure ML1, thereby forming a second stack structure ML2. The third material layers 223 and the fourth material layers 215 may be formed of the same material as described in FIG. 3A.

The first and second material layers 203 and 205 of the first stack structure ML1 may be formed to a uniform thickness. Further, the third and fourth material layers 223 and 215 of the second stack structure ML2 may be formed to a uniform thickness. Accordingly, when a subsequent etching process for forming a stepped structure in a contact area is performed, the stepped structure can be stably formed at an end portion of each of the first and second stack structures ML1 and ML2.

After that, the same processes as described in FIGS. 3A and 3B are performed which thereby form first preliminary holes 231 penetrating the second stack structure ML2.

Subsequently, a fifth material layer 233 is formed of the same material through the same processes as described in FIG. 3C, thereby defining a first air-gap AG1 inside the first preliminary holes 231.

Figure 4B:
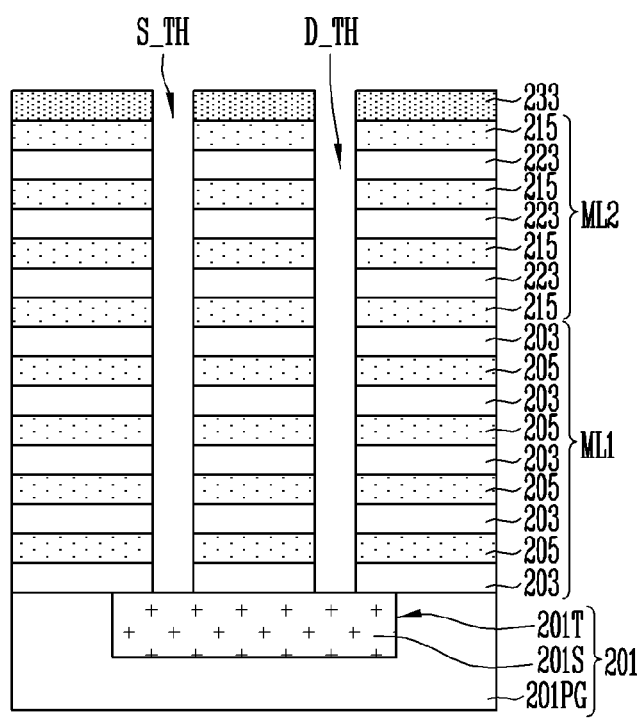

In FIG. 4B, the same processes as described in FIGS. 3D and 3E are performed, thereby forming vertical through holes S_TH and D_TH penetrating from the fifth material layer 233 to the first stack structure ML1. The vertical through holes S_TH and D_TH include a source-side vertical through hole S_TH and a drain-side vertical through hole D_TH. The source-side vertical through hole S_TH and the drain-side vertical through hole D_TH may be connected to both ends of the trench 201T to expose the sacrificial layer 201S of the lower structure 201.

According to an embodiment of the invention, the source-side vertical through hole S_TH and the drain-side vertical through hole D_TH are formed using the processes described in FIGS. 3D and 3E. Accordingly, it is possible to secure an etch margin in the etching processes for forming the source-side vertical through hole S_TH and the drain-side vertical through hole D_TH, thereby reducing the occurrence of open defects in the narrow and long source-side vertical through hole S_TH and the narrow and long drain-side vertical through hole D_TH.

Figure 4C:
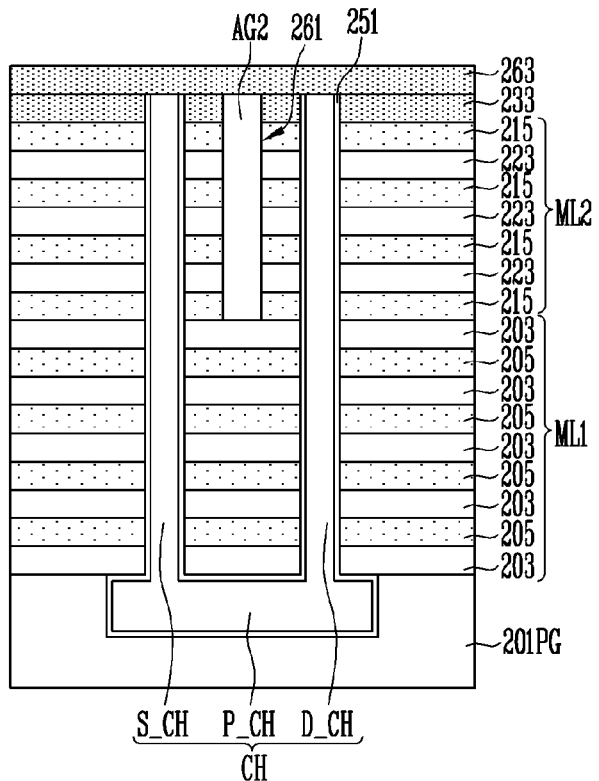

In FIG. 4C, the sacrificial layer (201S of FIG. 4B) is removed through the source-side vertical through hole S_TH and the drain-side vertical through hole D_TH. Accordingly, the trench (201T of FIG. 4B) is opened. Subsequently, a memory layer 251 and a channel layer CH are formed through the same processes as described in FIG. 3F.

According to an embodiment of the invention, the channel layer CH is formed along the source-side vertical through hole (S_TH of FIG. 4B), the trench (201T of FIG. 4B), and the drain-side vertical through hole (D_TH of FIG. 4B). The channel layer CH may include a source-side channel layer S_CH, a pipe channel layer P_CH, and a drain-side channel layer D_CH. The source-side channel layer S_CH is disposed inside the source-side vertical through hole (S_TH of FIG. 4B). In addition, the drain-side channel layer D_CH is disposed inside the drain-side vertical through hole (D_TH of FIG. 4B). The pipe channel layer P_CH is disposed in the trench (201T of FIG. 4B) while electrically coupling the source-side channel layer S_CH and the drain-side channel layer D_CH to each other.

Subsequently, a first preliminary slit 261 penetrating the fifth material layer 233 and the second stack structure ML2 between the source-side vertical through hole (S_TH of FIG. 4B) and the drain-side vertical through hole (D_TH of FIG. 4B) is formed through the same processes as described in FIG. 3G.

After that, a sixth material layer 263 is formed of the same material through the same processes as described in FIG. 3G, thereby defining a second air-gap AG2 inside the first preliminary slit 261. Moreover, the sixth material layer 263 may be formed of the same material as the fifth material layer 233.

Figure 4D:
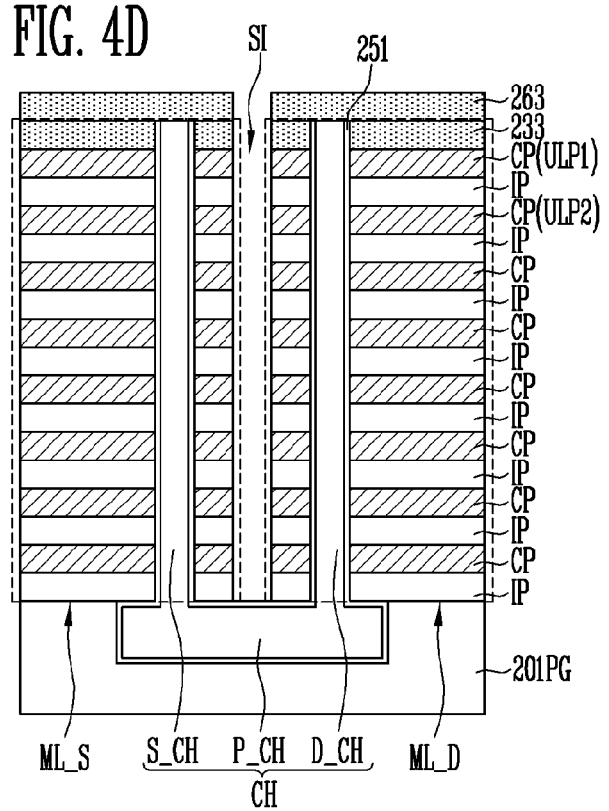

In FIG. 4D, a through slit SI penetrating from the sixth material layer 263 to the first stack structure ML1 is formed between the source-side channel layer S_CH and the drain-side channel layer D_CH through the same processes as described in FIG. 3H.

According to an embodiment of the invention, the through slit SI is formed using the processes described in FIGS. 3G and 3H. Accordingly, it is possible to secure an etch margin in the etching processes for forming the through slit SI, thereby easily forming the narrow and long through slit SI.

Subsequently, the same processes as described in FIG. 3I are performed, thereby forming conductive patterns CP and insulating patterns IP, which are separated from each other by the through slit SI. The conductive patterns CP and the insulating patterns IP may be separated into a source-side stack structure ML_S and a drain-side stack structure ML_D by the through slit SI. The source-side stack structure ML_S surrounds the source-side channel layer S_CH, and includes conductive patterns CP and insulating patterns IP, which are alternately stacked along the source-side channel layer S_CH. The drain-side stack structure ML_D surrounds the drain-side channel layer D_CH, and includes conductive patterns CP and insulating patterns IP, which are alternately stacked along the drain-side channel layer D_CH.

Among the conductive patterns CP described above, upper conductive patterns ULP1 and ULP2 of at least one layer from the topmost layer most distant from the lower structure 201 may be used as the source select line SSL or drain select line DSL shown in FIG. 1B. Further, the other conductive patterns CP may be used as the word lines WL_S and WL_D shown in FIG. 1B. More specifically, upper conductive patterns ULP1 and ULP2 of the source-side stack structure MLS are used as the source select line SSL. In addition, upper conductive patterns ULP1 and ULP2 of the drain-side stack structure MLD are used as the drain select line DSL.

Figure 5:
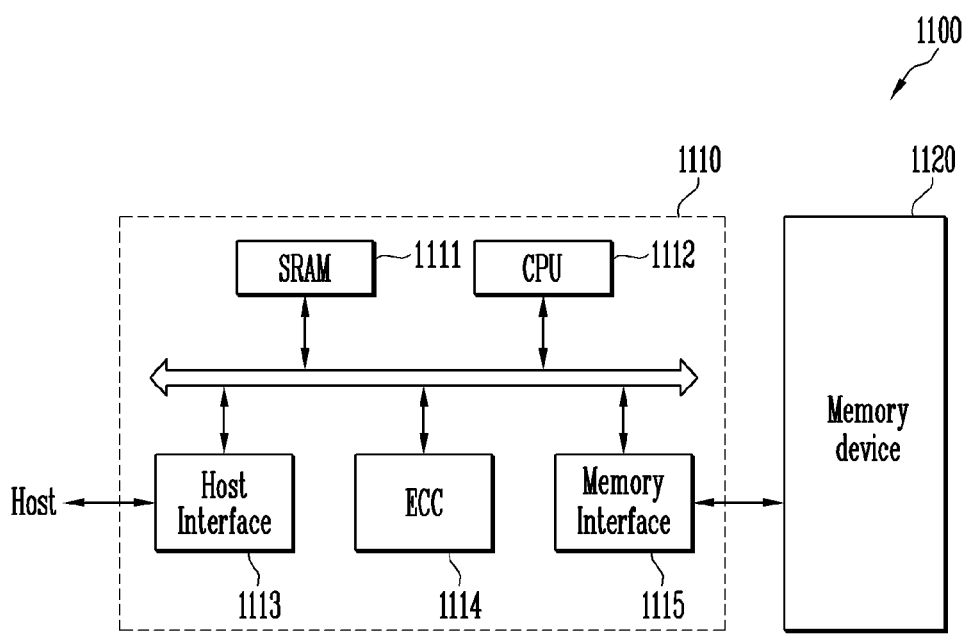
FIG. 5 is a configuration view illustrating a memory system according to an embodiment of the invention.

Referring to FIG. 5, a configuration view illustrating a memory system according to an embodiment of the invention is illustrated.

In FIG. 5, the memory system 1100 according to an embodiment of the invention includes a memory device 1120 and a memory controller 1110.

The memory device 1120 has the structures of the embodiments described in FIGS. 1A to 4D. Further, the memory device 1120 may be a multi-chip package formed of a plurality of flash memory chips.

The memory controller 1110 is configured to control the memory device 1120, and may include an SRAM 1111, a CPU 1112, a host interface 1113, an ECC 1114, and a memory interface 1115. The SRAM 1111 is used as an operation memory of the CPU 1112, the CPU 1112 performs a general control operation for data exchange of the memory controller 1110. Further, the host interface 1113 includes a data exchange protocol for a host electrically coupled with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1110 may communicate with the outside (e.g., the host) through one among various interface protocols, such as USB, MMC, PCI-E, SATA, PATA, SCSI, ESDI, and IDE.

Figure 6:
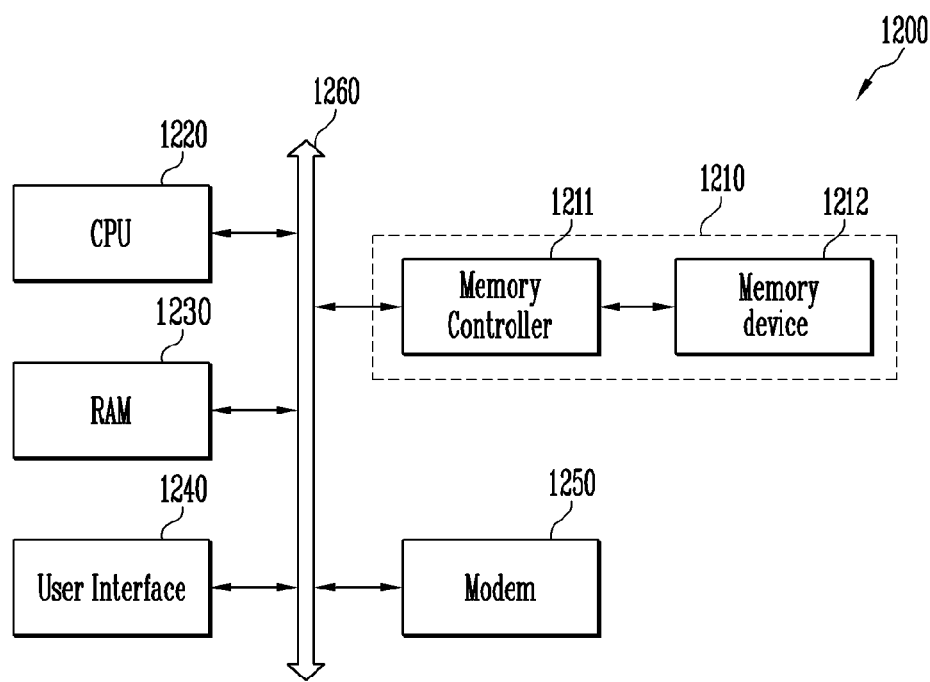
FIG. 6 is a configuration view illustrating a computing system according to an embodiment of the invention.

Referring to FIG. 6, a configuration view illustrating a computing system according to an embodiment of the invention is illustrated.

In FIG. 6, the computing system 1200 according to an embodiment of the invention may include a CPU 1220, a RAM 1230, a user interface 1240, a modem 1250, and a memory system 1210, which are electrically coupled to a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 5, may be configured with a memory device 1212 and a memory controller 1211.

In the embodiments of the invention, when a through structure (e.g., a through hole or through slit) penetrating a plurality of stack structures is formed, an air-gap is defined inside a preliminary structure (e.g., a preliminary hole or preliminary slit) corresponding to an upper end of the through structure. Accordingly, it is possible to simplify the process of forming the through structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the invention as set forth in the following claims.

What is claimed is:

1. A method of manufacturing a semiconductor device, the method comprising:
    forming on a lower structure, a first stack structure in which first material layers and second material layers are alternately stacked;
    forming, on the first stack structure, a second stack structure in which third material layers and fourth material layers are alternately stacked;
    forming preliminary holes penetrating the second stack structure;
    forming a fifth material layer covering the preliminary holes on the second stack structure to define a first air-gap inside the preliminary holes; and
    forming through holes connected to the preliminary holes by penetrating from the fifth material layer overlapping the preliminary holes to the first stack structure.

2. The method of claim 1, wherein the fifth material layer includes an undoped silicate glass (USG) oxide layer.

3. The method of claim 1, further comprising:
forming a preliminary slit penetrating the fifth material layer and the second stack structure between the through holes;
forming a sixth material layer covering the preliminary slit on the fifth material layer such that a second air-gap is defined inside the preliminary slit; and
forming a through slit connected to the preliminary slit by penetrating from the sixth material layer overlapping the preliminary slit to the first stack structure.

4. The method of claim 3, wherein the sixth material layer is formed of the same material as the fifth material layer.

5. The method of claim 3, wherein the sixth material layer includes a USG oxide layer.

6. The method of claim 3, further comprising:
removing the second material layers and the fourth material layers through the through slit; and
filling seventh material layers in areas in which the second material layers and the fourth material layers are removed.

7. The method of claim 3, wherein the third material layers are formed of the same material as the first material layers, and the fourth material layers are formed of the same material as the second material layers.

8. The method of claim 6, wherein the first and third material layers are formed of an oxide, and the second and fourth material layers are formed of a nitride.

9. The method of claim 6, wherein the seventh material layers are formed of a conductive material.

10. The method of claim 1, wherein the lower structure includes a source area.

11. The method of claim 10, further comprising:
forming channel layers electrically coupled to the source area inside the through holes.

12. The method of claim 1, wherein the forming of the lower structure includes:
forming a pipe gate;
forming a trench by etching the pipe gate; and
filling a sacrificial layer inside the trench.

13. The method of claim 12, wherein the through holes are connected to both ends of the trench to expose the sacrificial layer through the through holes.

14. The method of claim 13, further comprising:
removing the sacrificial layer exposed through the through holes to allow the trench to be opened; and
forming channel layers electrically coupled to each other along the inside of the trench and an interior portion of the through holes.

15. A method of manufacturing a semiconductor device, the method comprising:
forming a first stack structure on a lower structure;
forming a second stack structure on the first stack structure;
forming channel layers penetrating the second stack structure and the first stack structure;
forming a preliminary slit penetrating the second stack structure between the channel layers;
forming a material layer covering the preliminary slit on the second stack structure to define an air-gap inside the preliminary slit; and
forming a through slit connected to the preliminary slit by penetrating from the material layer overlapping the preliminary slit to the first stack structure.

16. The method of claim 15, wherein the material layer includes a USG oxide layer.

17. The method of claim 15, wherein each of the first and second stack structures includes oxide layers and nitride layers which are alternately stacked.

18. The method of claim 17, further comprising:
removing the nitride layers of the first and second stack structures through the through slit; and
filling a conductive material in areas in which the nitride layers are removed.

* * * * *